United States Patent [19]

Greenberg

[11] 4,393,095
[45] Jul. 12, 1983

[54] CHEMICAL VAPOR DEPOSITION OF VANADIUM OXIDE COATINGS

[75] Inventor: Charles B. Greenberg, Murrysville, Pa.

[73] Assignee: PPG Industries, Inc., Pittsburgh, Pa.

[21] Appl. No.: 344,257

[22] Filed: Feb. 1, 1982

[51] Int. Cl.³ .................. B05D 5/12; B05D 3/02; C03C 17/245
[52] U.S. Cl. ............................... 427/87; 427/109; 427/160
[58] Field of Search .................. 427/87, 109, 160

[56] References Cited

U.S. PATENT DOCUMENTS 3,483,110 12/1969 Rozgonyi .................. 204/192
4,307,942 12/1981 Chahroudi ................ 350/353

Primary Examiner—James R. Hoffman
Attorney, Agent, or Firm—Donna L. Seidel

[57] ABSTRACT

A method is disclosed for the chemical vapor deposition of vanadium oxide film on glass substrates, as well as a thermochromic $VO_2$ film for the variable transmittance of solar energy and a conductive $V_2O_3$ film, both formed by chemical vapor deposition employing liquid vanadium compounds.

17 Claims, 3 Drawing Figures

CHEMICAL VAPOR DEPOSITION OF VANADIUM OXIDE COATINGS

FIELD OF THE INVENTION

The present invention relates generally to the art of metal oxide coated glass, and more particularly to the art of vanadium oxide coated glass.

THE PRIOR ART

U.S. Pat. No. 3,483,110 to Rozgonyi discloses a method for making thin films of $VO_2$ that possess the essential metal-semiconductor phase transition exhibited by the single crystal form, and that do not suffer deterioration under repeated cycling through the transition. In one embodiment, the process involves the steps of sputtering a $V_2O_5$ cathode in an inert atmosphere in the presence of a desired substrate to produce an amorphous film of $VO_x$, where x is greater than 1.5 but less than 2, and then either weakly oxidizing the film to $VO_2$, or strongly oxidizing the film to $V_2O_5$ and then reducing the $V_2O_5$ to $V_2O_3$. Alternatively, a vanadium cathode may be sputtered in an inert atmosphere in a similar manner to produce a polycrystalline vanadium film, which is first oxidized to $V_2O_5$ and then reduced to $V_2O_3$.

SUMMARY OF THE INVENTION

The present invention involves the chemical vapor deposition of vanadium oxide films from a liquid organovanadium compound such as vanadium propylate. Vanadium oxide films containing $VO_2$ exhibit both electrical and optical switching at a nominal transition temperature of about 68° C. Glass coated with a vanadium oxide film containing $VO_2$ in accordance with the present invention is particularly useful for passive solar energy control since it has significantly lower infrared transmittance in the metallic phase compared with the infrared transmittance of the semiconducting phase. Vanadium oxide films containing $V_2O_2$ are electroconductive at ambient temperature, exhibiting a resistivity less than about 1,000 ohms per square at a film thickness with luminous transmittance of about 24 to 35 percent on six millimeter thick clear float glass. Vanadium oxide films containing $V_2O_5$ may also be prepared by chemical vapor deposition in accordance with the present invention. These films may subsequently be reduced to form thermochromic films containing $VO_2$.

DETAILED DESCRIPTION OF THE PREFERRED EMBODIMENTS

Numerous metal and/or metal oxide coatings are known to be useful for solar energy control. Such coatings typically reflect a high proportion of incident solar energy to minimize heat gain inside a structure, while allowing sufficient transmission of the visible portion of the spectrum for interior lighting. A particularly desirable architectural window for passive solar energy control would be a variable transmittance window that would minimize transmittance in the summer when the temperature is high and incident solar energy is greatest, but transmit solar energy when the temperature is low. Variable transmittance in a glass window is achievable by photochromism, which involves darkening in response to solar ultraviolet radiation, typically employing silver halides. However, absorption by the glass of solar radiation over the full spectral range results in heating and bleaching which deteriorate the photochromic properties of the glass. The present invention achieves variable transmittance by means of a thermochromic response, the result of an optical switching when a vanadium oxide film is heated by absorbed solar energy.

Figure 1:
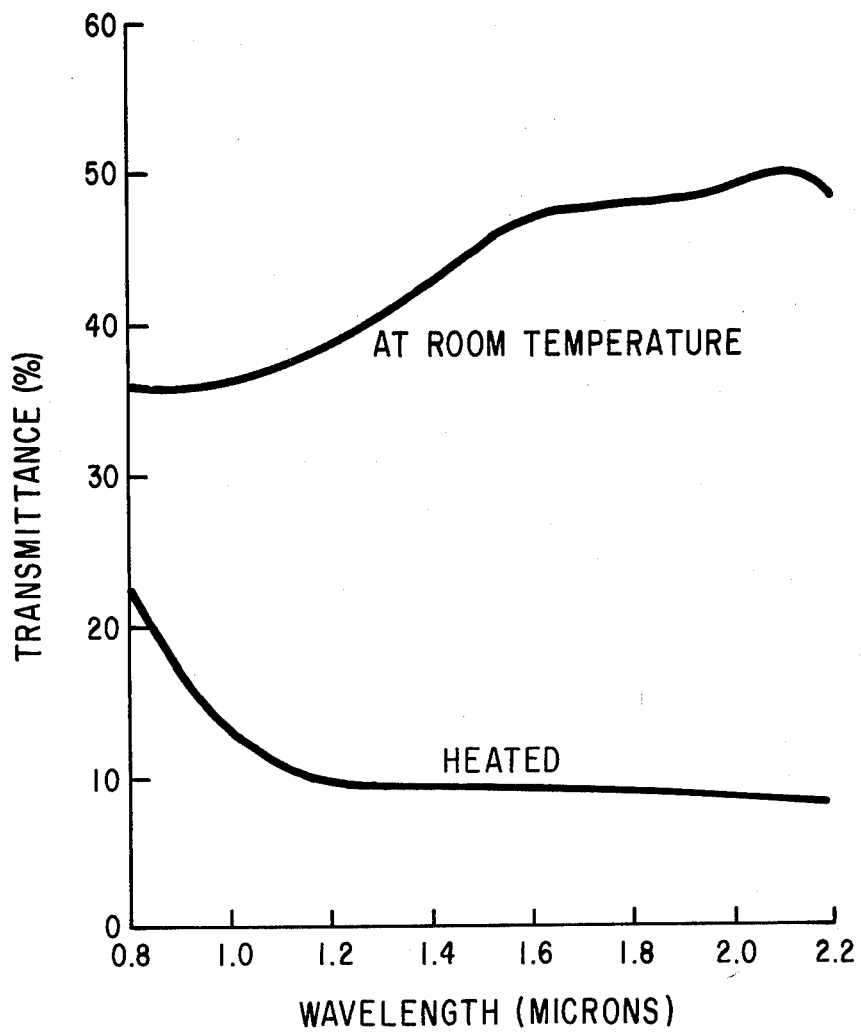
FIG. 1 illustrates the optical switching of a vanadium oxide ($VO_2$) film formed directly by chemical vapor deposition.
Figure 2:
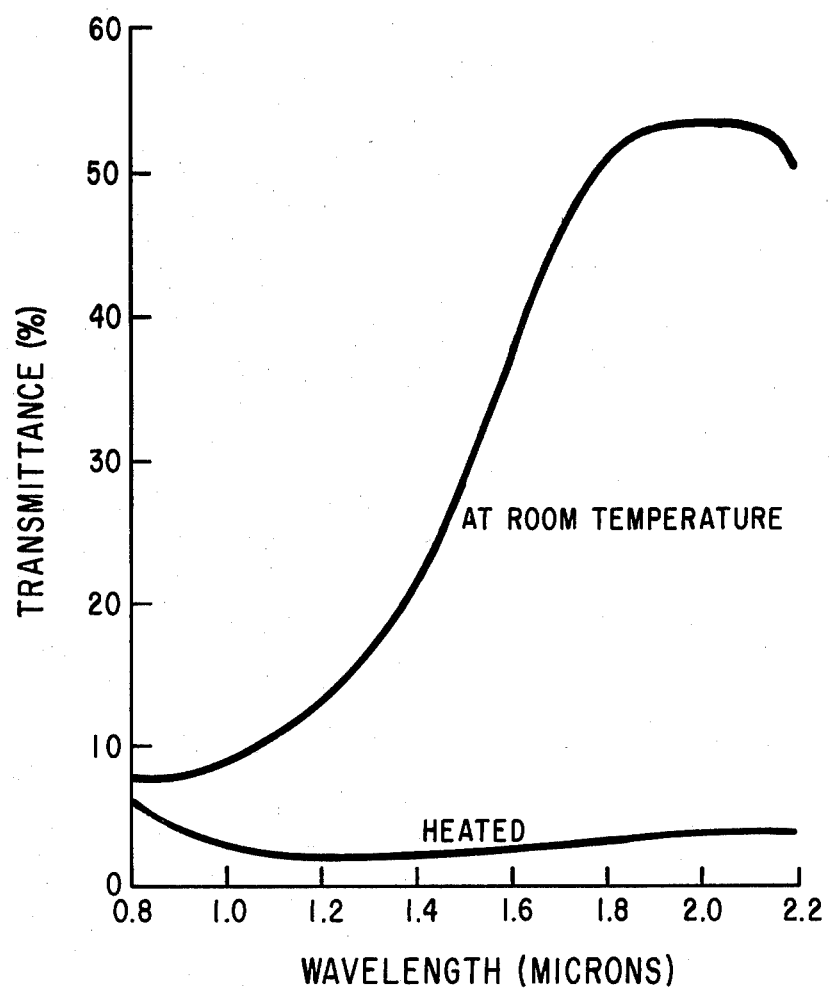
FIG. 2 illustrates the optical switching of a vanadium oxide ($VO_2$) film formed by the reduction of a $V_2O_5$ film formed by chemical vapor deposition.

Vanadium oxide ($VO_2$) undergoes a phase transition from the monoclinic crystallographic class to the tetragonal at a nominal temperature of 68° C. This phase transition is accompanied by a rapid switch in electrical resistivity from semiconducting behavior to metallic, a resistivity change of about $10^3$ to $10^5$-fold in a single crystal. In addition to electroconductive switching, a vanadium oxide ($VO_2$) film also undergoes a substantial optical switching in the infrared spectral region as shown in FIGS. 1 and 2, along with a small amount of switching in the spectral range of visible light.

Vanadium oxide films are prepared in accordance with the present invention by chemical vapor deposition from organovanadium compounds such as liquid vanadium i-propylate and vanadium n-propylate. To be useful as a thermochromic window for passive solar energy control, the vanadium oxide coating should provide large optical switching in the solar infrared spectral range, a temperature range for switching that correlates with the actual temperatures attained by a window exposed to solar radiation, and adequate switching properties at a film thickness thin enough to avoid iridescence. Preferably, film thicknesses range from about 100 to 1,500 Angstroms. These properties may be provided by vanadium oxide films prepared in accordance with the present invention.

Thin films of vanadium oxide can be prepared on glass substrates by chemical vapor deposition using a variety of organovanadium compounds, preferably those which are in liquid form at standard temperature and pressure. Soda-lime-silica float glass and borosilicate glass are useful as substrates. The glass substrates are preheated, typically to a temperature of at least about 350° C., in a conventional tube furnace open at both ends for ingress and egress of the substrates. An air driven pusher arm may be employed to feed a substrate into and out of the heating zone and onto a conveyor belt which carries the substrate to a CVD coating chamber located below an exhaust hood. The CVD coating chamber contains an organovanadium compound, such as liquid vanadium i-propylate or vanadium n-propylate, which is heated to a sufficiently high temperature to vaporize the vanadium compound. The organovanadium compound vapors are carried in a gas stream to the heated substrate, whereupon the organovanadium compound pyrolyzes to form vanadium oxide.

In a preferred embodiment of the present invention, vanadium i-propylate is vaporized and carried in a stream of nonoxidizing gas such as nitrogen or forming gas to a heated glass substrate. A vanadium oxide coating is formed on the glass which then travels within a tunnel flushed with forming gas to an annealing furnace wherein the coated glass is cooled to ambient temperature. When $VO_2$ is formed from vanadium i-propylate, the resultant vanadium oxide coated glass is semiconducting at ambient temperatures with a solar infrared transmittance typically above 30 percent at wavelengths between 0.8 and 2.2 microns, while above the transition temperature, nominally 68° C., the $VO_2$ containing film is characteristically conductive and has a total solar infrared transmittance less than about 15 percent.

To enhance the optical response of a vanadium oxide film, it may be useful to prime the glass surface prior to chemical vapor deposition of the vanadium oxide coating. Optimum priming may be obtained with a tin oxide coating, typically 700 to 800 Angstroms thick. The tin oxide primer coating is preferably prepared by pyrolytic deposition of an organotin compound. Silicon and titanium dioxide films are also useful as primers. The use of such primer films, especially $SnO_2$, appears to enhance the crystallinity and formation of $VO_2$ rather than other vanadium oxides, thereby resulting in a $VO_2$ rich film which has very good optical switching properties.

The optical switching properties of the vanadium oxide coating are determined by scanning in transmittance mode with a Cary 14 spectrophotometer (comparable spectrophotometers now available from Varian Associates) across the spectral range of 0.8 to 2.2 microns. The vanadium oxide coated glass sample is held in an insulated holder with a beam pass opening. Two cylindrical 25 watt heaters in contact with the glass edges just outside the beam pass opening are used to heat the vanadium oxide coated glass sample through the switching temperature range. A spectral scan is run both before and after heating without moving the sample. Typical results are shown in FIGS. 1 and 2.

Figure 3:
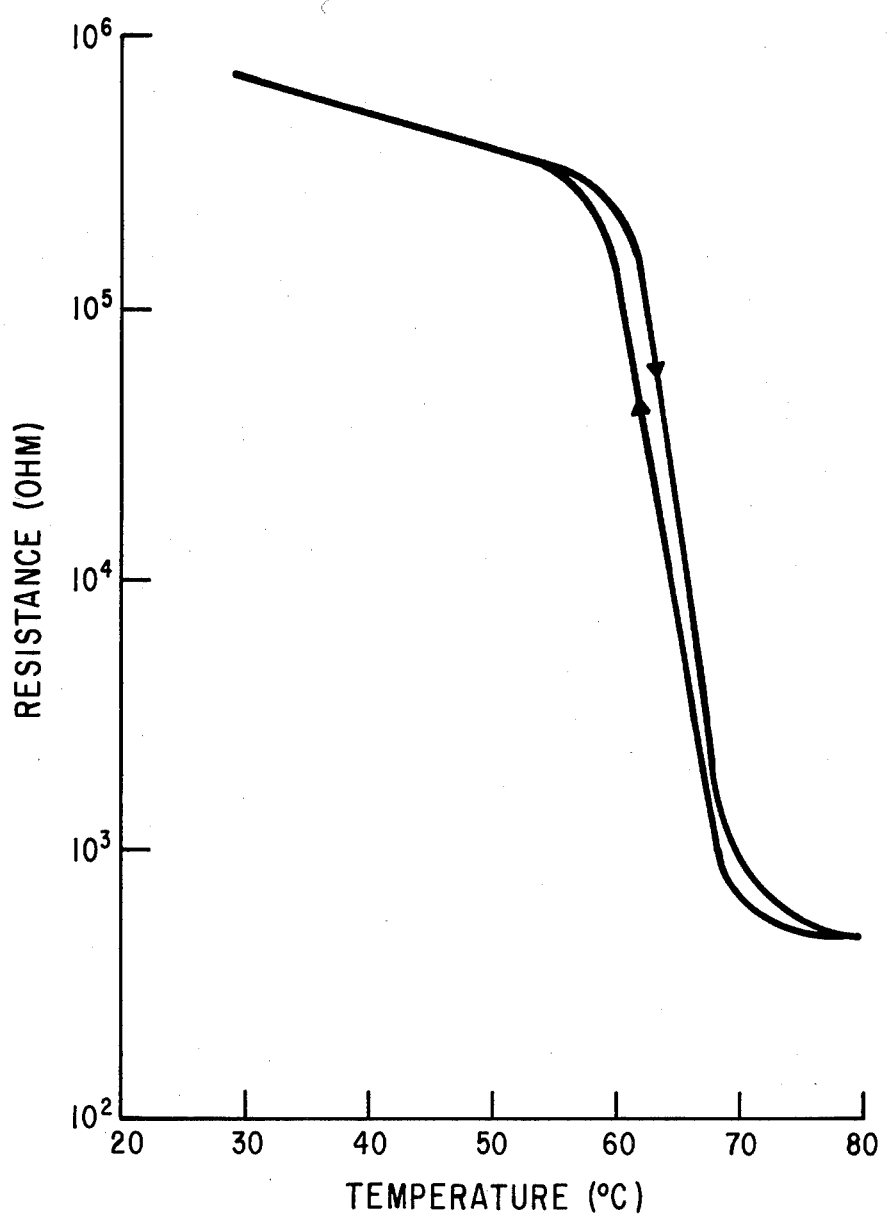
FIG. 3 illustrates the electroresistive switching which accompanies the optical switching measured in FIG. 2.

The temperature range of the optical switching is determined in a separate experiment, which also provides a measure of the thermoresistive switching. The flat-head probe of an Omega Amprobe ® Fastemp temperature measuring device (available from Omega Engineering, Inc., Standord, Conn.) is clipped flush onto a narrow strip of the vanadium oxide film surface. In close proximity on either side of the probe are alligator clips connected to an ohmmeter for measurement of resistance. The resistance is measured as a function of temperature as the coated sample is heated through the transition temperature range. A sample measurement is illustrated in FIG. 3.

In general, it appears that of the $10^3$ to $10^5$-fold thermoresistive switching capability of vanadium oxide ($VO_2$), a thermoresistive switching on the order of about two-fold is sufficient to provide optical switching of the required magnitude for passive solar energy control in the spectral range of 0.8 to 2.2 microns. The temperature range for optical switching, around the nominal 68° C. known for relatively pure single crystals of vanadium oxide ($VO_2$), is near the range of about 45° to 60° C. actually attained in windows in summertime southern exposure. Also, it appears that optical switching properties are attainable with vanadium oxide films sufficiently thin to avoid visible iridescence.

Higher magnitude thermoresistive switching may be obtained by utilizing liquid vanadium i-propylate carried in nitrogen gas to form highly oxidized vanadium oxide ($V_2O_5$) on a glass surface heated to at least about 300° C. The vanadium oxide coated glass travels within a tunnel flushed with air to an annealing furnace also flushed with air, wherein the coated glass is cooled to ambient temperature. The resultant vanadium oxide coating is primarily $V_2O_5$. To obtain the thermochromic $VO_2$, the vanadium oxide coating is reduced in a reducing atmosphere, preferably forming gas containing a small proportion of aromatic hydrocarbon, at a temperature of about 325° to 475° C. The thermochromic $VO_2$ film formed in this manner is semiconducting at ambient temperatures with a solar infrared transmittance as illustrated in FIG. 2, while above the transition temperature, the $VO_2$ film is characteristically conductive with a total solar infrared transmittance less than about 10 percent. The thermoresistive switching is about 1,000 fold as shown in FIG. 3.

Conductive thin films of vanadium oxide containing $V_2O_3$ can be prepared by chemical vapor deposition utilizing vanadium n-propylate. Glass substrates are preheated, typically to a temperature of at least about 450° C., in a conventional tube furnace open at both ends for ingress and egress of the substrates. Liquid vanadium n-propylate is vaporized and carried in a stream of nitrogen gas to the heated substrate, whereupon the organovanadium compound pyrolyzes to form vanadium oxide. The vanadium oxide coated glass travels through a tunnel flushed with forming gas to an annealing furnace also flushed with forming gas, wherein the coated glass is cooled to ambient temperature. The resulting conductive $V_2O_3$ film is characteristically gray in transmission, compared with yellow to brown for $VO_2$, and typically has a resistance measuring about 200 to 300 ohms per square. Preferred film thicknesses range from about 200 to 1,500 Angstroms.

The present invention will be further understood from the descriptions of specific examples which follow.

EXAMPLE I

A glass substrate is heated to a temperature of about 635° C. and contacted with a solution comprising two parts by volume dibutyltin diacetate and one part by volume methanol. A tin oxide coating about 700 to 800 Angstroms thick is formed on the glass surface. The tin oxide primed glass passes through a chemical vapor deposition chamber containing liquid vanadium i-propylate which is heated to 127° C. to vaporize the organovanadium compound. The organovanadium vapors are carried in nitrogen to the moving glass substrate which is at a temperature of about 530° C. The vanadium oxide film formed on the glass substrate is yellow by transmission in fluorescent lighting. The vanadium oxide film exhibits a transition over the temperature range of about 55° to 75° C. The electrical switching of this film is from about 13,000 ohms at ambient temperature to about 5,000 ohms above the transition temperature range. The accompanying optical switching is shown in FIG. 1.

EXAMPLE II

Vanadium i-propylate is heated to 127° C. in a chemical vapor deposition chamber. The organovanadium vapors are carried in nitrogen to a moving glass substrate preheated to a temperature of about 400° C. to deposit a vanadium oxide film on the unprimed glass substrate. The coated glass is cooled to ambient temperature in air, resulting in a vanadium oxide composition comprising $V_2O_5$. The $V_2O_5$ film is reduced to thermochromic $VO_2$ by heating at a temperature of about 450° to 463° C. for about 23 minutes in a forming gas atmosphere containing an aromatic hydrocarbon (obtained by heating at 160° C. a bath of Califlux TT, a process oil available from Witco Chemical Corp., Los Angeles, Calif.) The $VO_2$ film exhibits an electrical switching from greater than $10^5$ ohms at ambient temperature to about 500 to 800 ohms above 68° C., with an optical switching to less than 10 percent transmittance of solar radiation between 0.8 and 2.2 microns, as shown in FIG. 2.

EXAMPLE III

Vanadium n-propylate is heated to 127° C. to form vapors which are carried in nitrogen to a moving glass substrate preheated to a temperature of about 530° C. A conductive vanadium oxide ($V_2O_3$) film is formed on the glass substrate. The coated glass is cooled in a forming gas atmosphere. The vanadium oxide film is gray by transmission in fluorescent lighting and exhibits a resistance at ambient temperature of about 150 to 190 ohms per square at a thickness which allows luminous transmittance of about 24 percent.

The above examples are offered to illustrate the present invention. Various other substrates, such as borosilicate glass, may also be used in the production of vanadium oxide films in accordance with the present invention. Other organovanadium compounds, such as vanadium ethylate, butylate, as well as vanadium oxychloride, $VOCl_3$, may also be used. Post deposition reduction of $V_2O_5$ may be avoided by incorporating a reducing agent, such as an aromatic hydrocarbon, in the atmosphere of the chamber during deposition. The chemical vapor deposition method of the present invention is particularly useful for coating a moving ribbon of glass, such as in a continuous float glass process. Useful methods and apparatus for chemical vapor deposition are described in U.S. Pat. No. 3,850,679 and No. 3,951,100, the disclosures of which are incorporated herein by reference. Various atmospheres may be utilized; oxidizing atmospheres such as air, inert atmospheres such as nitrogen or argon, and reducing atmospheres such as forming gas or other mixtures of inert gas and reducing agents. The thermochromic $VO_2$ films are preferably employed in multiple glazed window units for solar energy control by variable transmittance of infrared radiation. A preferred multiple glazed unit configuration is described in U.S. Pat. No. 3,919,023, the disclosure of which is incorporated herein by reference. The scope of the present invention is defined by the following claims.

I claim:
1. A method for the chemical vapor deposition of vanadium oxide films comprising the steps of:
   a. heating a glass substrate to a sufficient temperature to convert a vanadium compound to vanadium oxide;
   b. vaporizing a liquid vanadium compound;
   c. contacting a surface of said heated glass substrate with the vapor of said vanadium compound to deposit a vanadium oxide film on the glass surface.
2. The method according to claim 1, wherein the vanadium compound is vanadium i-propylate.
3. The method according to claim 2, wherein the vanadium compound and the glass substrate are exposed to an oxidizing atmosphere, and a film containing $V_2O_5$ is formed.
4. The method according to claim 3, wherein the $V_2O_5$ coated glass is further exposed to a reducing atmosphere to reduce the $V_2O_5$ to $VO_2$.
5. The method according to claim 1, wherein the glass substrate is coated with a primer layer selected from the group consisting of tin oxide, silicon, and titanium oxide prior to the chemical vapor deposition of vanadium oxide.
6. The method according to claim 5, wherein the vaporized vanadium i-propylate contacts the glass surface in a nonoxidizing atmosphere and a thermochromic film containing $VO_2$ is formed.
7. The method according to claim 1, wherein the organovanadium compound is vanadium n-propylate.
8. The method according to claim 7, wherein the vanadium oxide coated glass is exposed to a nonoxidizing atmosphere and an electrically conductive film containing $V_2O_3$ is formed.
9. The method according to claim 1, wherein the vanadium oxide film is deposited to a thickness of about 100 to 1,500 Angstroms.
10. A method for depositing a vanadium oxide film comprising the steps of:
    a. heating a glass substrate to a temperature of at least about 350° C.;
    b. vaporizing vanadium i-propylate;
    c. conveying the vaporized vanadium i-propylate in a stream of nonoxidizing gas to the substrate;
    d. contacting a surface of said heated glass substrate with the vaporized vanadium i-propylate in a nonoxidizing atmosphere to deposit thereupon a vanadium oxide film; and
    e. cooling the vanadium oxide coated glass in a reducing gas atmosphere to obtain a thermochromic film containing $VO_2$.
11. A method for depositing a vanadium oxide film comprising the steps of:
    a. heating a glass substrate to a temperature of at least about 300° C.;
    b. vaporizing vanadium i-propylate;
    c. conveying the vaporized vanadium i-propylate in a stream of inert gas to the substrate;
    d. contacting a surface of the substrate with the vaporized vanadium i-propylate to form a vanadium oxide film; and
    e. cooling the vanadium oxide coated glass in air to obtain a film containing $V_2O_5$.
12. The method according to claim 11, wherein the $V_2O_5$ is reduced to $VO_2$ in a reducing atmosphere.
13. The method according to claim 12, wherein the reducing atmosphere comprises forming gas.
14. The method according to claim 13, wherein the reducing atmosphere further comprises an aromatic hydrocarbon.
15. A method for making a conductive coated glass article comprising the steps of:
    a. heating a glass substrate to a temperature of at least about 400° C.;
    b. vaporizing vanadium n-propylate;
    c. conveying said vaporized vanadium n-propylate to said substrate in a stream of nitrogen;
    d. contacting a surface of said heated glass substrate with the vaporized vanadium n-propylate to deposit thereupon a film containing $V_2O_3$; and
    e. cooling the coated glass article in an atmosphere insufficiently oxidizing to convert the $V_2O_3$ to $VO_2$.
16. The method according to claim 15, wherein the $V_2O_3$ coated glass is cooled in forming gas.
17. The method according to claim 15, wherein the film containing $V_2O_3$ is deposited to a thickness of about 200 to 1,500 Angstroms and has a resistivity less than 1,000 ohms per square.

* * * * *